United States Patent
Kishi et al.

(10) Patent No.: US 8,323,758 B2
(45) Date of Patent: Dec. 4, 2012

(54) ELECTRONIC APPARATUS

(75) Inventors: Yuji Kishi, Yokohama (JP); Ken Tsukamoto, Yokohama (JP); Yoshinori Horikawa, Hiratsuka (JP); Shinji Nishi, Yokohama (JP); Kazuma Kishi, Hitachinaka (JP); Akitoshi Morishima, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 1032 days.

(21) Appl. No.: 12/327,845

(22) Filed: Dec. 4, 2008

(65) Prior Publication Data

US 2009/0148638 A1    Jun. 11, 2009

(30) Foreign Application Priority Data

Dec. 7, 2007    (JP) .................................. 2007-316527

(51) Int. Cl.
*B32B 1/00*    (2006.01)
*B32B 1/02*    (2006.01)
*B32B 1/04*    (2006.01)
*B32B 15/08*    (2006.01)
*H01R 13/502*    (2006.01)
*H01L 23/06*    (2006.01)
*H05K 5/00*    (2006.01)

(52) U.S. Cl. ...................... 428/34.1; 428/35.7; 428/35.8; 428/36.92; 174/563; 174/565; 361/679.01

(58) Field of Classification Search ................. 428/34.1, 428/35.7, 35.8, 36.9, 36.91, 36.92; 312/223.1–223.6; 174/520–565, 53–64; 361/679.01–837

See application file for complete search history.

(56) References Cited

U.S. PATENT DOCUMENTS

| | | | | |
|---|---|---|---|---|
| 5,031,070 A * | 7/1991 | Hsu | ............................. | 361/679.6 |
| 5,593,219 A * | 1/1997 | Ho | ................................. | 312/263 |
| 5,839,804 A * | 11/1998 | Ho | ............................. | 312/223.2 |
| 6,557,957 B2 * | 5/2003 | Nagata et al. | .............. | 312/223.1 |

FOREIGN PATENT DOCUMENTS

| | | |
|---|---|---|
| JP | 08-046366 | 2/1996 |
| JP | 09-091539 | 4/1997 |
| JP | 11-236067 | 8/1999 |
| JP | 2000-112569 | 4/2000 |
| JP | 2001-084747 | 3/2001 |
| JP | 2002-108502 | 4/2002 |

* cited by examiner

*Primary Examiner* — Walter B Aughenbaugh

(74) *Attorney, Agent, or Firm* — Antonelli, Terry, Stout & Kraus, LLP.

(57) ABSTRACT

A design cover attachment structure is provided configured to facilitate an attachment/removal of a design cover composed of a plurality of decorative plates. At least a top surface and each of side surfaces of a casing of an electronic apparatus are covered with a design cover composed of a top surface decorative plate, and left and right side surface decorative plates. The left and right side surface decorative plates are provided with second engagement portions configured to be engaged with first engagement portions provided to a bottom surface decorative plate mounted on the casing or a bottom surface of the casing, so that the left and right side surface decorative plates are mounted on the casing. Third engagement portions configured to be engaged with fourth engagement portions provided to the top surface decorative plate, so that the top surface decorative plate is mounted on the left and right side surface decorative plates.

8 Claims, 13 Drawing Sheets

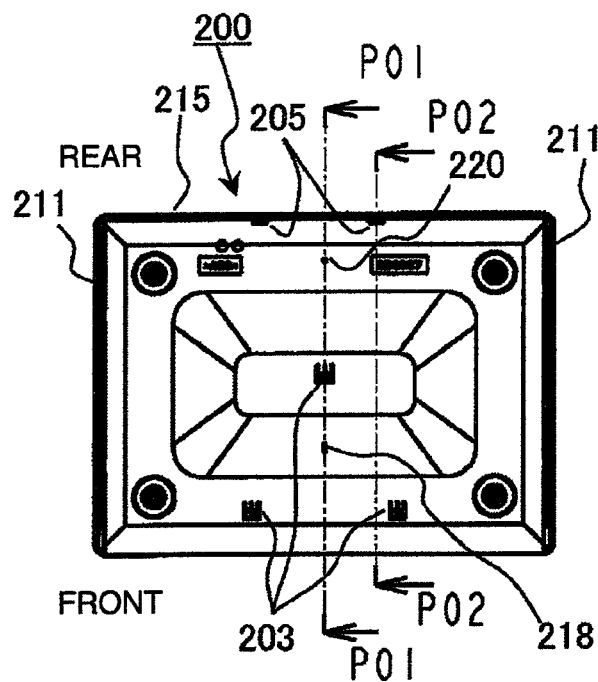
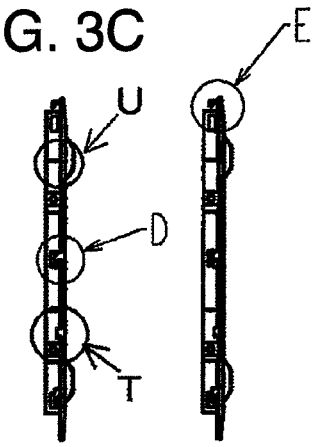
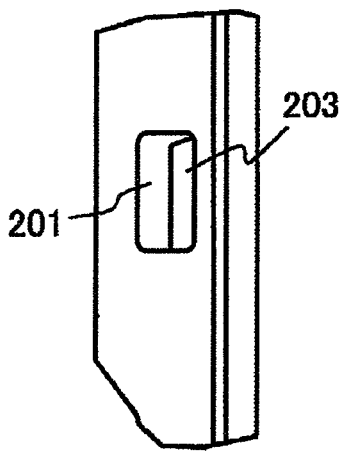
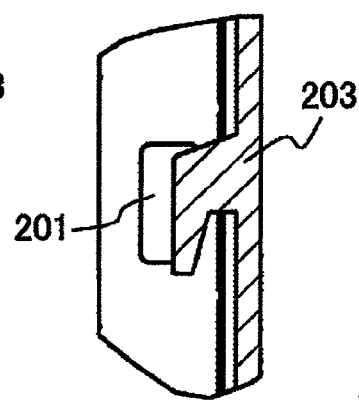
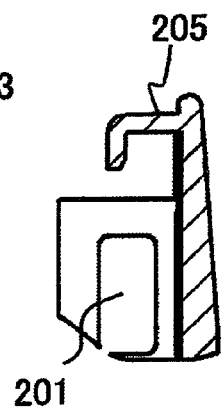

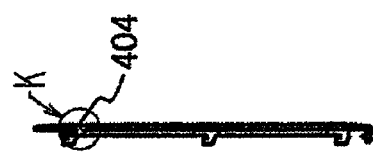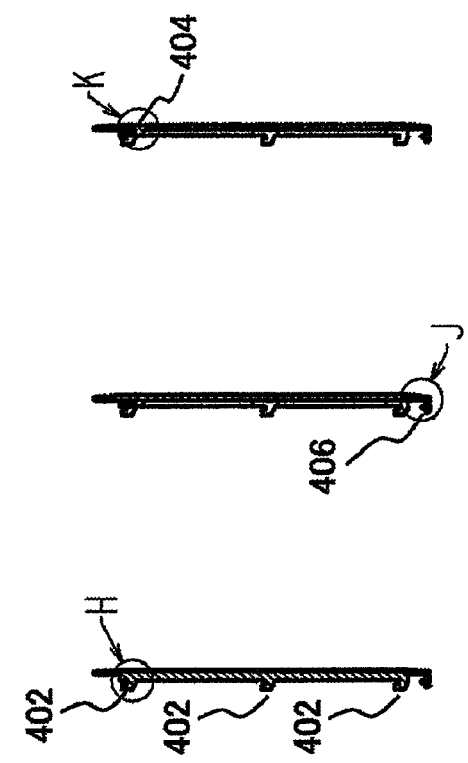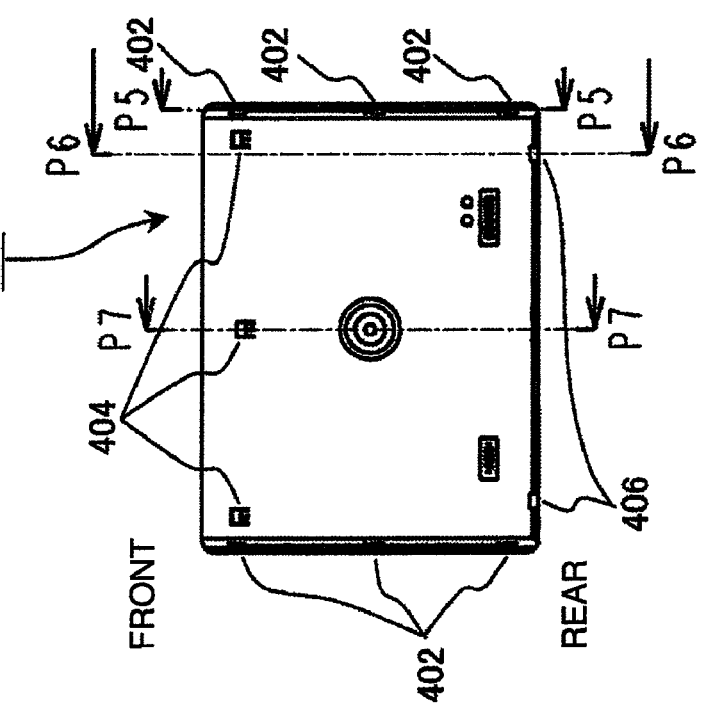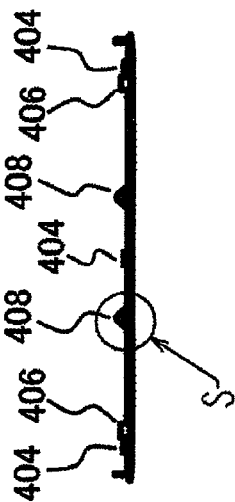

FRONT          REAR

FRONT          REAR

ELECTRONIC APPARATUS

INCORPORATION BY REFERENCE

The present application claims priority from Japanese application JP2007-316527 filed on Dec. 7, 2007, the content of which is hereby incorporated by reference into this application.

BACKGROUND OF THE INVENTION (1) Field of the Invention

The present invention relates to techniques for attaching a design cover to an outer surface of a casing of an electronic apparatus.

(2) Description of related art

Hitherto, a technique has been known that covers an outer surface of an electronic apparatus with a design cover when an outer appearance of the electronic apparatus is finalized. For example, according to a technique disclosed in JP-A-11-236067, in order to decrease the number of assembly steps, hook portions provided on both side surfaces of a top surface cover are engaged with engagement holes provided on both side surfaces of a base chassis in correspondence to the hook portions by sliding the top surface cover from the rear side. To the contrary, for example, according to a technique disclosed in JP-A-8-046366, hook portions are provided on both side surfaces of a base chassis, and engagement holes are provided on both side surfaces of a top surface cover so as to correspond to the hook portions. Moreover, according to a technique disclosed in JP-A-9-091539, for better outer appearance, at least a top surface and both side surfaces, for example, of a metallic box-like casing of an electronic apparatus are covered with design covers (also referred to as decorative plates or decorative covers).

In the case where at least the top surface and both side surfaces of the box-like casing of an electronic apparatus are covered with design covers (outer frame decorative plates) similar to the conventional techniques, when the design covers are manufactured by integral molding, the die size becomes large and thus increases the die cost. Moreover, when the shape of the design covers becomes complicated, the molding conditions become complicated and there is a concern that shrinkage or the like may occur easily.

In lieu of such an integral-molded design cover, when the design cover is configured by a plurality of decorative plates covering a top surface, a left side surface, and a right side surface, respectively, since the number of decorative plates increases, the number of assembly steps of attaching them to the box-like casing, for example, by means of screws or the like increases accordingly. Moreover, the screws are exposed to the outside, and thus, the outer appearance is degraded.

Moreover, in the conventional techniques, there is no disclosure of a design cover structure for improving the overall aesthetic appearance of the electronic apparatus considering both a transverse installation of the electronic apparatus (in which the largest surface such as the bottom surface of the electronic apparatus is used as the installation surface) and a vertical installation (in which a side surface or the like other than the bottom surface of the electronic apparatus is used as the installation surface).

Furthermore, in order to decrease the cost of replacing the design cover, it would be desirable to individually replace the respective decorative plates of the top surface or the side surfaces. However, none of the conventional techniques teaches a structure capable of individually replacing the respective decorative plates.

BRIEF SUMMARY OF THE INVENTION

In view of the foregoing, it is an object of the present invention to provide a technique for facilitating attachment/removal of a design cover composed of a plurality of decorative plates mounted on an electronic apparatus.

According to the present invention, there is provided an electronic apparatus comprising: a box-like casing; a top surface cover provided on a top surface of the casing; a first side surface cover provided on one side surface of the casing; and a second side surface cover provided on the other side surface of the casing, wherein: the top surface cover engages with the first side surface cover and the second side surface cover; and the first and second side surface covers are attached to a side surface side or a bottom surface side of the casing, and the top surface cover is coupled to a rear surface of the casing. The electronic apparatus may further comprise a bottom surface cover provided on the bottom surface of the casing, and the first and second side surface covers may be engaged with the bottom surface cover.

Moreover, the top surface cover may be coupled to the casing by being screwed onto the rear surface of the casing. Moreover, protrusive engagement portions may be provided on one sides of the top surface cover, the first side surface cover, and the second side surface cover with engagement holes configured to receive the protrusive engagement portions being provided on the other sides thereof, and when the protrusive engagement portions are inserted into the engagement holes and either one of the top surface cover and the first and second side surface covers is slid, the top surface cover may be engaged with the first and second side surface covers. Furthermore, protrusive engagement portions may be provided on one sides of the bottom surface cover, the first side surface cover, and the second side surface cover with engagement holes configured to receive the protrusive engagement portions being provided on the other sides thereof, and when the protrusive engagement portions are inserted into the engagement holes and either one of the bottom surface cover and the first and second side surface covers is slid, the bottom surface cover may be engaged with the first and second side surface covers.

Furthermore, the casing may be made of metal, and the top surface cover, the first and second side surface covers, and the bottom surface cover may be made of resin.

Since the design cover attachment structure according to the present invention has such a configuration, by providing a plurality (e.g., two) of projections extending toward the side surfaces of the casing to a rear end surface of the top surface cover (hereinafter, the covers attached to respective surfaces will be sometimes referred to as "decorative plates") and forming screw holes, for example, for fixation to the casing in the projections, the design cover having the top surface decorative plate being engaged with the side surface decorative plates mounted on the casing can be fixed to the casing from the rear side via the screw holes by means of a plurality of screws.

Moreover, in the present invention, since the design cover can be fixed to the bottom surface of the box-like casing with least number (for example, two) of screws by means of the design cover attachment structure, it is possible to decrease the number of assembly steps. Furthermore, the design cover can be removed in a simple manner by first removing two fixing screws, for example, on the rear side, sliding the top surface decorative plate in a direction opposite to the mounting direction to be removed, and sliding the side surface decorative plates in a direction opposite to the mounting direction to be removed. In addition, since the respective decorative plates are engaged with each other by engagement portions rather than by screw fixing, the design cover removed from the casing can be easily disassembled into the respective surface decorative plates, and therefore, the respective decorative plates can be individually replaced.

Furthermore, in the present invention, since the decorative plate is also mounted on the bottom surface of the casing, it is possible to improve the overall aesthetic appearance of an electronic apparatus in either case of a vertical installation where the bottom surface of the casing is used as the installation surface, or a transverse installation where the side surface of the casing is used as the installation surface.

According to the present invention, it is possible to facilitate attachment/removal of a design cover composed of a plurality of decorative plates to/from a casing of an electronic apparatus.

Other objects, features and advantages of the invention will become apparent from the following description of the embodiments of the invention taken in conjunction with the accompanying drawings.

BRIEF DESCRIPTION OF THE SEVERAL VIEWS OF THE DRAWING

FIGS. 3A to 3G are schematic structural views of a bottom surface decorative plate according to the present embodiment.

FIGS. 6A to 6E are schematic structural views of a top surface decorative plate according to the present embodiment.

DETAILED DESCRIPTION OF THE INVENTION

Figure 1A:
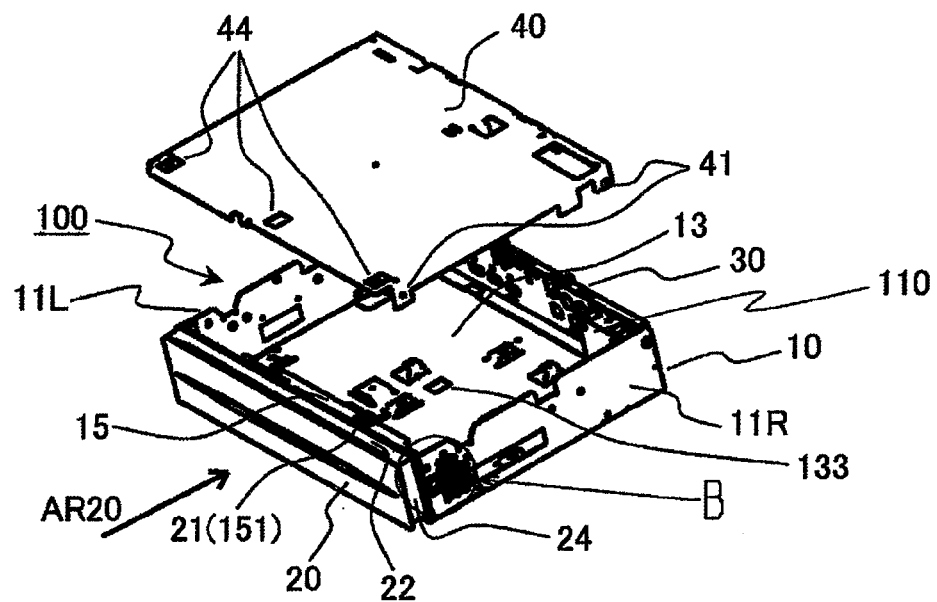
FIGS. 1A and 1B are schematic views illustrating a structure of a base casing according to the embodiment of the invention.

Hereinafter, preferred embodiments of the present invention will be described with reference to the drawings. In the following description, although a receiver for receiving television broadcast signal is used as an electronic apparatus, the present invention is not limited to this. It is noted that elements having the same functions are denoted by the same reference symbols in the entire drawings and repetitive description thereof will not be given.

A receiver as an electronic apparatus according to the present invention contains therein EMI (Electromagnetic interference) sources such as a non-illustrated electronic circuit board or other electronic components, with the surrounding thereof being covered with a metallic body in order to reduce EMI caused by such sources, so that spurious radiation (EMI) external from the receiver can be blocked. That is, a metallic box-like casing is used as a casing of the electronic apparatus. In the present embodiment, for better external appearance, side surfaces of a generally rectangular parallelepiped portion having a generally rectangular sectional shape (hereinafter, referred to as "body portion" for the simplicity's sake) excluding a front panel and a rear panel of the metallic box-like casing are covered with decorative plates as corresponding covers, respectively. In this example, considering vertical installation of the receiver, it is assumed that the decorative plates are provided to a lower surface (bottom surface) as well as the top surface and the left and right side surfaces. However, the present invention is not limited to this. It goes without saying that if only transverse installation is considered as the installation type, the bottom surface decorative plate may not be provided, and necessary changes may be made to the embodiment described below.

First, a description of a structure of a base casing as the metallic casing and respective decorative plates covering the body portion of the base casing will be provided with reference to FIGS. 1 to 8. In the drawing figures, a front panel side will be denoted by "front" and a rear panel side will be denoted by "rear," if necessary. Moreover, a surface (installation surface) confronting a plane, such as a table, a board, or a floor, on which the electronic apparatus is installed will be referred to as a bottom surface, a surface confronting the bottom surface will be referred to as a top surface, and two surfaces other than a surface (front surface) close to the front panel and a surface (rear surface) close to the rear panel sandwiched between the bottom surface and the top surface will be referred to as side surfaces. Since the present embodiment considers a case where the electronic apparatus is vertically installed, there is a case where either one of the side surfaces becomes the installation surface. The circuit components include a video processor for performing demultiplexing, decoding, and image-processing on received television broadcast signals and a micro processor for controlling the receiver, and if necessary, a hard disk drive (HDD) for recording a video signal, a slot portion to which a removable HDD is inserted, and a controller for controlling the removable HDD.

Figure 1B:
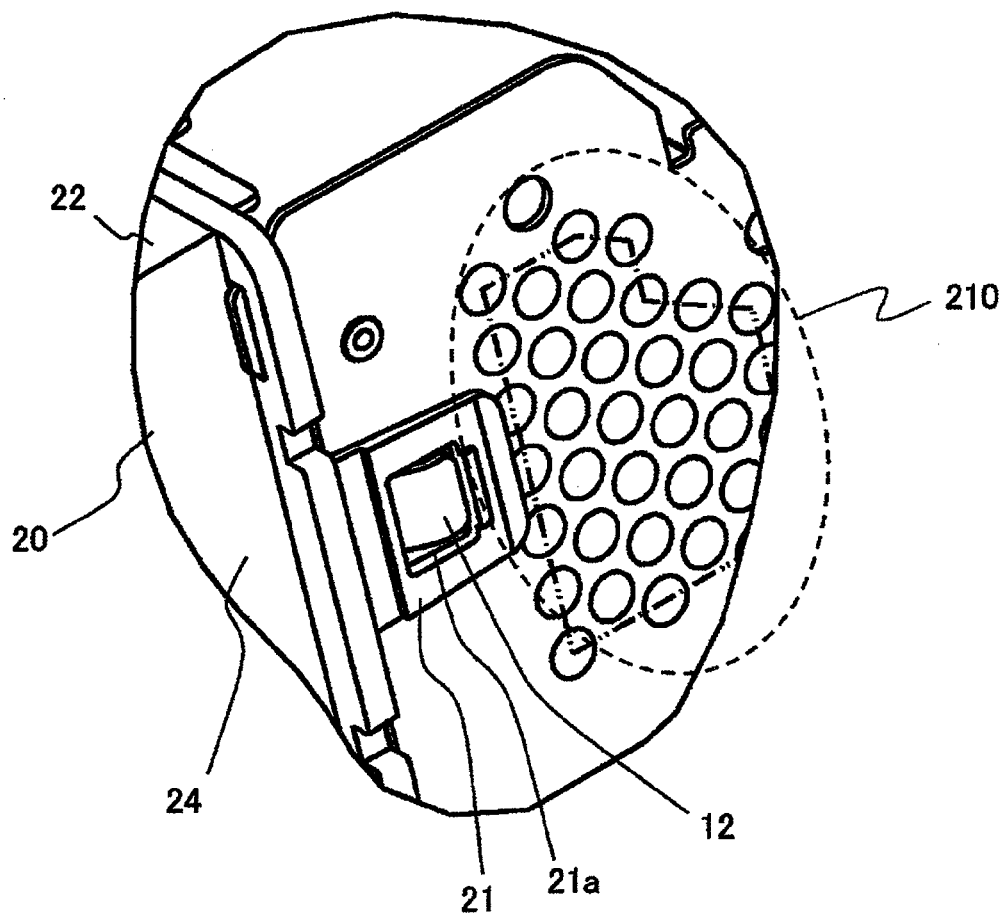

FIGS. 1A and 1B are schematic views illustrating a structure of a base casing according to the present embodiment. In the drawing figures, FIG. 1A is a perspective view schematically illustrating the base casing, and FIG. 1B is an enlarged view of the B part in FIG. 1A. In FIG. 1A, for better understanding of the structure of the base casing, a top surface plate of the base casing is separately illustrated. As for the directions, they are defined relative to a vertically installed base casing as viewed from a front panel side. Specifically, the right side in the horizontal direction is defined as the right, the left side thereof defined as the left, the upper side in the vertical direction defined as the top, and the lower side thereof defined as the bottom.

As shown in FIGS. 1A and 1B, a base casing 100 includes a metallic base chassis 10, a resin-made front panel 20, a metallic rear panel 30, and a metallic top surface plate 40 as a top plate. The base chassis 10 includes a bottom surface plate part 13, left and right side surface plate parts 11 (11L, 11R), and a front surface plate part 15, which are integrally formed by pressing or the like.

A hook 151 bent into an L shape is provided to an upper right end portion of the front surface plate part 15 of the base chassis 10, and hooks 12 (see FIG. 1B) formed by cutting and raising are provided on portions of both side surface plate parts 11 (11L, 11R) close to the front surface (the front panel 20). Moreover, projection pieces 21 are provided on a top surface 22 and both side surfaces 24 of the front panel 20, respectively, and engagement holes 21a are provided around the respective projection pieces 21. Therefore, when the front panel 20 is pressed against the base chassis 10 in the direction indicated by the arrow AR20, the hooks 12 and 151 are engaged with the engagement holes 21a of the projection pieces 21 of the front panel 20 as shown in the B-part enlarged view of FIG. 1B, and the front panel 20 is latched to the base chassis 10.

On the bottom surface plate part 13 of the base chassis 10, for example, three engagement holes 133 for attaching a later-described bottom surface decorative plate thereto are formed at an approximately central part thereof and at portions thereof close to the front surface (detailed description thereof will be provided later with reference to FIGS. 8A to 8D).

The rear panel 30 is fixed to the base chassis 10 by means of non-illustrated screws.

The top surface plate 40 has its left and right end portions being bent into an L shape and is formed with screw holes 41 for fixing the base chassis 10 thereto being disposed at portions on both side surfaces thereof close to the front surface (front panel 20) and at the rear surface (rear panel 30), so that the top surface plate 40 can be fixed to the base chassis 10 by means of non-illustrated screws. Moreover, on the top surface plate 40, for example, three engagement holes 44 for attaching a later-described top surface decorative plate thereto are formed at the center thereof close to the front surface (front panel 20) and at left and right ends thereof.

Moreover, as shown in FIG. 1B, intake holes 210 for circulating outside air into the interior of the base casing 100 are formed in portions of the side surface plate part 11 disposed close to the front surface. Although the intake holes 210 are illustrated only for the right side surface plate part 11R in FIG. 1B, the same intake holes 210 are formed in the left side surface plate part 11L. Moreover, exhaust holes for a fan 110 are formed in the rear panel 30 close to the right side surface plate part 11R. When the fan 110 starts operating, outside air is drawn into the interior of the base casing 100 through the intake holes 210 provided on both left and right sides of the base casing 100 by the air-drawing action of the fan 110, cooling down electronic components or electronic circuits installed inside the base casing 100, and is then discharged by the fan 110 to the outside of the base casing 100.

Next, a description of a structure of the design cover mounted on a body portion of the base casing 100 described with respect to FIG. 1 will be provided.

Figure 2:
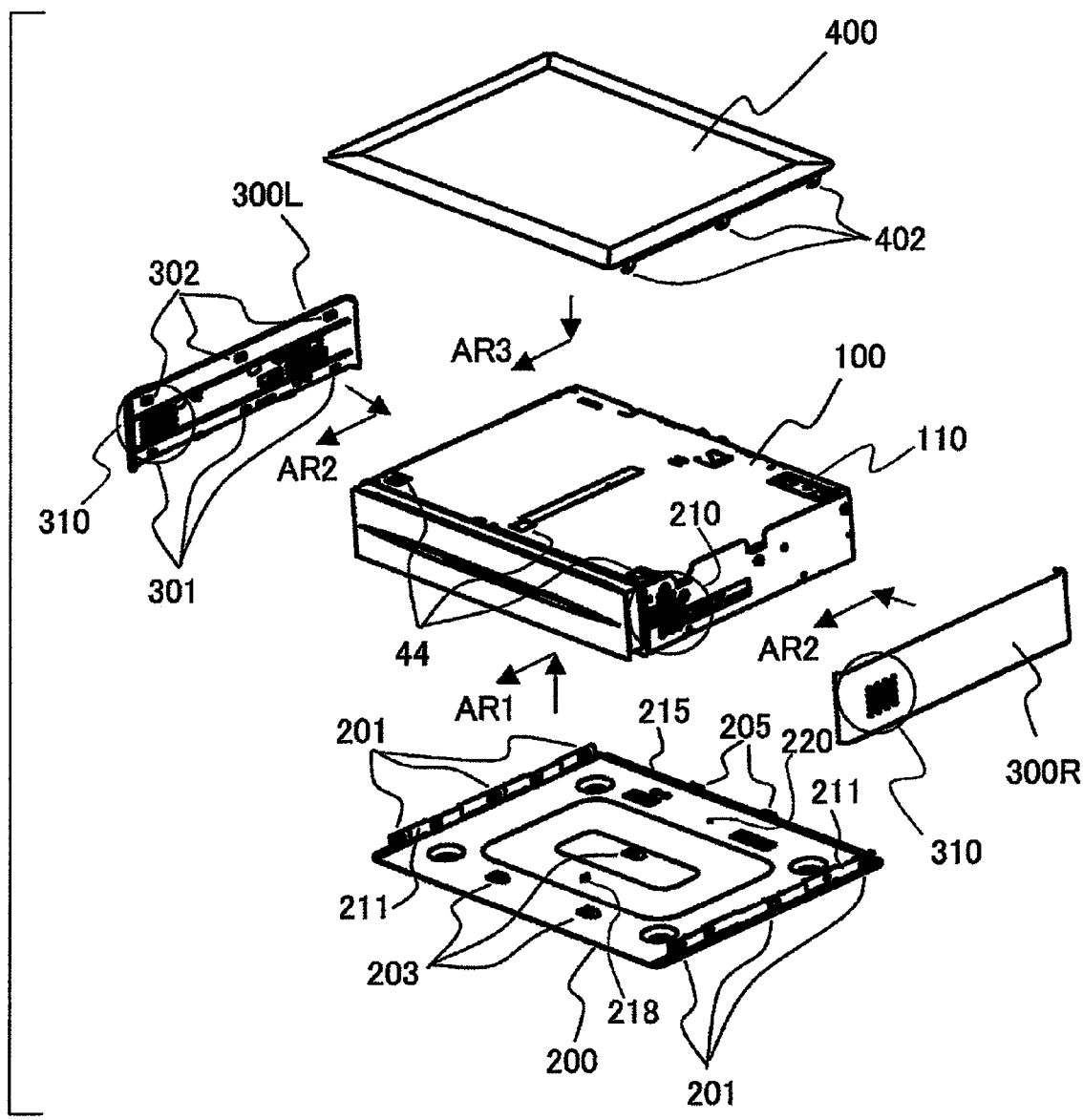
FIG. 2 is an exploded perspective view schematically illustrating a structure of the design cover according to the present embodiment.

FIG. 2 is an exploded perspective view schematically illustrating a structure of the design cover according to the present embodiment, which is mounted on a body portion of the base casing. As will be understood from FIG. 2, the design cover according to the present embodiment is composed of a plurality of plate-like covers (decorative plates) unlike the conventional techniques. Specifically, the design cover includes a bottom surface decorative plate 200 mounted on the bottom surface plate part 13 of the base casing 100 (that is, the base chassis 10), both side surface decorative plates 300 (300L, 300R) mounted on both side surface plate parts 11 (11L, 11R) of the base casing 100 (that is, the base casing 10), and a top surface decorative plate 400 mounted on the top surface plate 40 of the base casing 100. In this example, the respective decorative plates will be described as being made of resin.

The bottom surface decorative plate 200 includes an engagement portion (specifically, hooks 203, a projection 218, and a positioning projection 220) configured to be engaged with an engagement portion (specifically, engagement holes 133, a guide groove 135, and a positioning hole 137) provided to the bottom surface plate part 13 of the base casing 100 and a first engagement portion (an engagement hole 201) configured to be engaged with a second engagement portion (lower hooks 301) provided to both side surface decorative plates 300 (300L, 300R): detailed description of the specific engagement portions will be provided later. When the bottom surface decorative plate 200 is mounted on the bottom surface plate part 13, the projection 218 of the bottom surface decorative plate 200 is tightly fitted to the guide groove 135 formed in the bottom surface plate part 13 from the lower side as indicated by the arrow AR1, and the bottom surface decorative plate 200 is slid frontward (toward the front panel) along the guide groove 135 until the positioning projection 220 of the bottom surface decorative plate 200 is tightly fitted to the positioning hole 137 formed in the bottom surface plate part 13. In this way, the engagement portion (the hooks 203) of the bottom surface decorative plate 200 is tightly fitted to be engaged with the engagement portion (the engagement holes 133) formed in the bottom surface plate part 13. In the present embodiment, unlike the conventional techniques, the decorative plate 200 is mounted on the bottom surface as well as the top surface and both side surfaces. For this reason, it is possible to improve the overall aesthetic appearance of the electronic apparatus even when the electronic apparatus is vertically installed with the side surface of the casing used as the installation surface.

Moreover, both side surface decorative plates 300 (300L, 300R) each has the second engagement portion (the lower hooks 301) configured to be engaged with the first engagement portion (the engagement holes 201) of the bottom surface decorative plate 200 and a third engagement portion (upper hooks 302) configured to be engaged with a fourth engagement portion (hooks 402) provided to the top surface decorative plate 400: detailed description of the specific engagement portions will be provided later. When both side surface decorative plates 300 (300L, 300R) are mounted on the base casing 100 mounting the bottom surface decorative plate 200 thereon, the second engagement portion (the lower hooks 301) of both side surface decorative plates 300 (300L, 300R) is tightly fitted to the first engagement portion (the engagement holes 201) formed in the bottom surface decorative plate 200 from the side surface sides as indicated by the arrows AR2, and then, both side surface decorative plates 300 are slid frontward (toward the front panel) to be engaged. As shown in the drawing, cover-side intake holes 310 are formed in the side surface decorative plates 300L and 300R so as to correspond in position to the intake holes 210 formed in both side surface plate parts 11R and 11L of the base casing 100, respectively. Therefore, air is drawn to the interior of the base casing 100 through the cover-side intake holes 310 and the intake holes 210. In this manner, in the present embodiment, by forming the intake holes 310 in the side surface decorative plates 300L and 300R, the electronic apparatus can be effectively cooled while improving the overall aesthetic appearance.

Furthermore, the top surface decorative plate 400 has the fourth engagement portion (the hooks 402) configured to be engaged with the third engagement portion (the upper hooks 302) of both side surface decorative plates 300 (300L, 300R) and an engagement portion (hooks 404) configured to be engaged with an engagement portion (specifically, the engagement holes 44) formed in the top surface plate 40 of the base casing 100: detailed description of the specific engagement portions will be provided later. When the top surface decorative plate 400 is mounted on the base casing 100 mounting the bottom surface decorative plate 200 and both side surface decorative plates 300 (300L, 300R) thereon, the engagement portions (the hooks 404) of the top surface decorative plate 400 is tightly fitted to the engagement portion (the engagement holes 44) formed in the top surface plate 400 from the upper side as indicated by the arrow AR3, and then, the top surface decorative plate 400 is slid frontward (toward the front panel). In this way, the fourth engagement portion (the hooks 402) of the top surface decorative plate 400 is engaged with the third engagement portion (the upper hooks 302) of both side surface decorative plates 300 (300L, 300R).

In this manner, in the present embodiment, unlike the conventional techniques, the decorative plate 200 is mounted on the bottom surface as well as the top surface and both side surfaces. For this reason, when the electronic apparatus is vertically installed with the side surface of the casing used as the installation surface, the outer appearance of the design cover is determined by the top surface decorative plate 400, either one of the side surface decorative plates 300R and 300L, and the bottom surface decorative plate 200. Therefore, it is possible to improve the overall aesthetic appearance in case of the vertical installation. Therefore, according to the present embodiment, it is possible to improve the overall aesthetic appearance in either case of the vertical installation or the transverse installation. Furthermore, in the present embodiment, the electronic apparatus is vertically installed with the left side surface decorative plate 300L used as the installation surface so that a side surface (the right side surface decorative plate 300R) where the fan 110 is installed is on the upper side.

Figure 14:
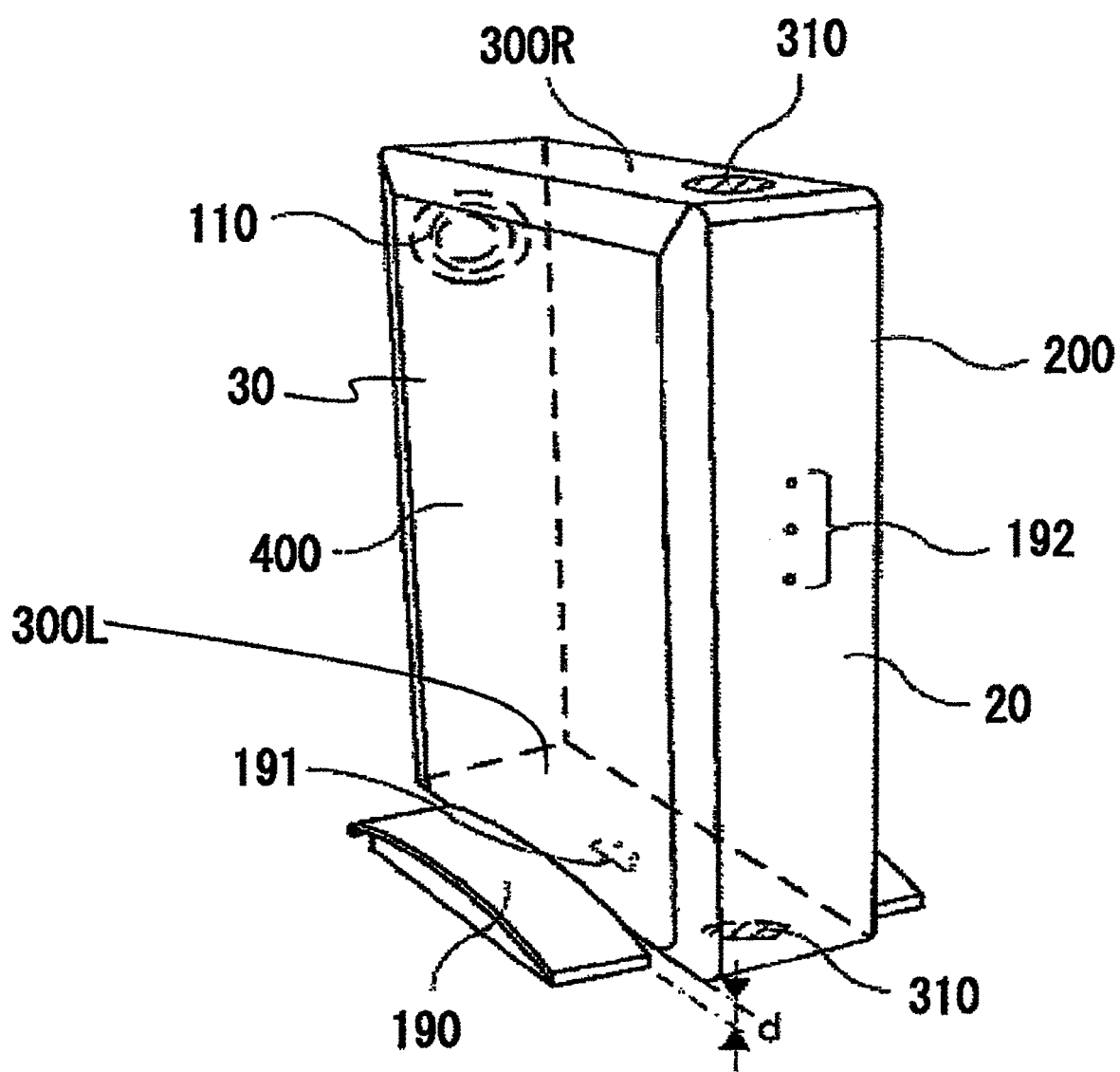
FIG. 14 is a view showing a state where an electronic apparatus in accordance with the present invention is vertically installed.

When the electronic apparatus is vertically installed, for example, stands 190 as shown in FIG. 14 are used. The stands 190 and the electronic apparatus are fixed to each other via a screw hole 191 formed in the left side surface decorative plate 300L. In this example, the stands 190 are designed with such a shape and dimension that when they support the electronic apparatus, as illustrated in FIG. 14, a gap d is formed between the left side surface decorative plate 300L and a floor surface or a table surface. By designing in such a manner, even when the electronic apparatus is vertically installed, the cover-side intake holes 310 formed in the left side surface decorative plate 300L are not blocked by the floor surface or the table surface. Owing to such a configuration, even when the electronic apparatus is vertically installed, air can be drawn into the base casing 100 through the cover-side intake holes 310 of the left side surface decorative plate 300L via the gap d on the lower side (that is, the left side surface decorative plate 300L side) of the electronic apparatus, cooling down the internal electronic components or electronic circuits while being heated by convection, and then discharged to the outside by the fan 110 disposed on the upper side. In this way, according to such a vertical installation, it is possible to effectively cool down the interior of the electronic apparatus. Moreover, the front panel is configured to transmit therethrough light from an LED 192 in order to show an operation state of the electronic apparatus.

A detailed description of the engagement of the design cover with the above-described base casing 100 will be provided later with reference to FIGS. 9A to 13.

Here, prior to describing a detailed structure of the respective decorative plates, a description of the engagement portions of the bottom surface decorative plate 200, the bottom surface plate part 13 of the base casing 100 engaging with the top surface decorative plate 400, and the rear panel 30 will be provided with reference to FIGS. 8A to 8D.

Figure 8A:
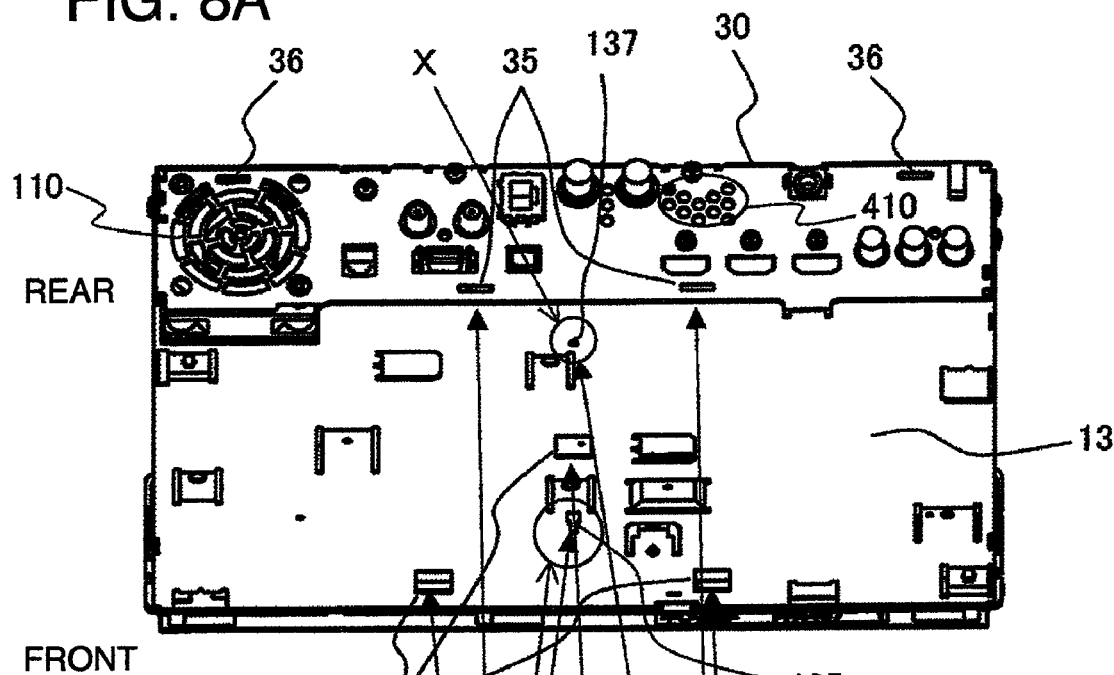
FIGS. 8A to 8D are views for explaining engagement portions provided to a bottom surface plate part of the base casing and a rear panel according to the present embodiment.
Figure 8B:
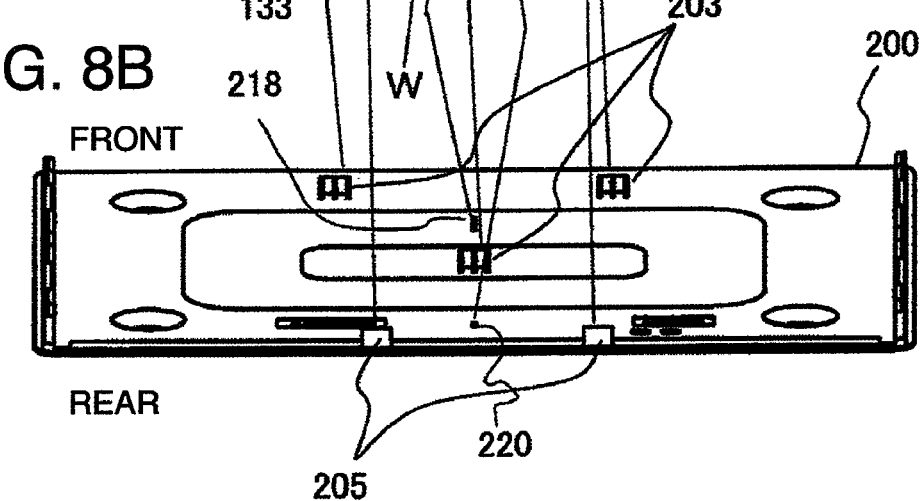
Figure 8C:
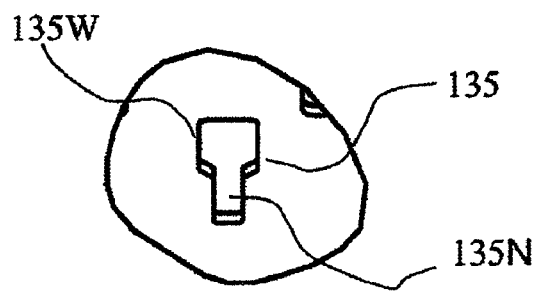
Figure 8D:

FIGS. 8A to 8D are views for explaining engagement portions provided to a bottom surface plate part of the base casing and a rear panel according to the present embodiment. In the drawing figures, FIG. 8A is a view of the base casing as viewed from an obliquely lower side of the rear panel, FIG. 8B is a view of the bottom surface decorative plate as viewed from an obliquely upper side of the rear panel, FIG. 8C is an enlarged view of the guide groove 135 in FIG. 8A, and FIG. 8D is an enlarged view of the positioning hole 137 in FIG. 8A. A description of a detailed structure of the bottom surface decorative plate 200 will be provided later with reference to FIGS. 3 and 4.

Referring to FIG. 8A, the bottom surface plate part 13 of the base casing 100 (that is, the base chassis 10) is provided with a plurality of engagement portions for engaging the bottom surface decorative plate 200 therewith. That is, the bottom surface plate part 13 is provided with a plurality of engagement holes 133 for attaching the bottom surface decorative plate 200 thereto. In this example, two engagement holes 133 are formed on the front panel side, and one engagement hole 133 is formed at the approximately central part thereof. As will be understood from FIG. 8B, these engagement holes 133 are engaged with the hooks 203 formed on a surface (hereinafter, referred to as "inner surface") of the bottom surface decorative plate 200, which is mounted on the bottom surface plate part 13.

The bottom surface plate part 13 is provided with the guide groove 135 for guiding and positioning the bottom surface decorative plate 200 and the positioning hole 137 for positioning with the bottom surface decorative plate 200. The guide groove 135 is provided with a wide-width portion 135W having a large width so that the projection 218 (details of which will be provided later) of the bottom surface decorative plate 200 can be easily fitted thereto and a narrow-width portion 135N having a narrow width for guiding the bottom surface decorative plate 200 and determining the horizontal position of the bottom surface decorative plate 200. The positioning hole 137 is approximately circular and engages with the positioning projection 220 (details of which will be provided later) of the bottom surface decorative plate 200.

The rear panel 30 is provided with two engagement holes 35 on both sides at the central portion thereof close to the bottom surface plate part 13 and two engagement holes 36 on both end sides distant from the bottom surface plate part 13 (that is, close to the top surface plate 40). The engagement holes 35 are engaged with hooks 205 of the bottom surface decorative plate 200, and the engagement holes 36 are engaged with hooks 406 (details of which will be provided later) of the top surface decorative plate. Moreover, rear-side intake holes 410 are formed in the rear panel 30 so that air can be drawn into the base casing 100 therethrough.

Next, a description of a structure of the respective decorative plates will be provided with reference to FIGS. 3 to 7.

Figure 4A:
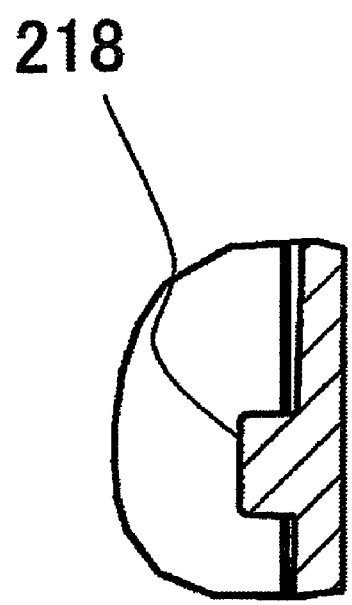
FIGS. 4A and 4B are schematic structural views of the bottom surface decorative plate according to the present embodiment.
Figure 4B:
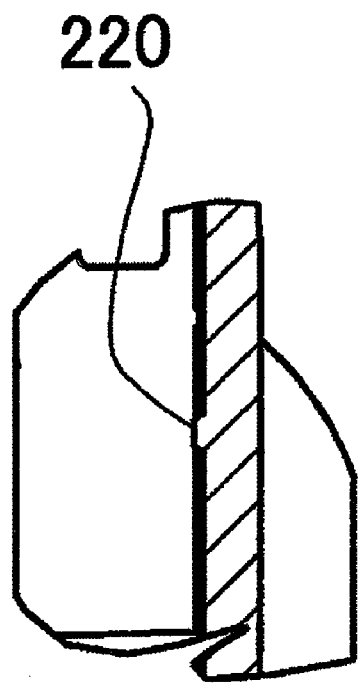

FIGS. 3 and 4 are schematic structural views of the bottom surface decorative plate according to the present embodiment. In the drawing figures, FIG. 3A is a top plan view of the bottom surface decorative plate as viewed from the inner surface, FIG. 3B is a side view thereof, FIG. 3C is a cross-sectional view taken along the line P01-P01 in FIG. 3A, FIG. 3D is a cross-sectional view taken along the line P02-P02 in FIG. 3A, FIG. 3E is an enlarged view of the C part in FIG. 3B, FIG. 3F is an enlarged view of the D part in FIG. 3C, FIG. 3G is an enlarged view of the E part in FIG. 3D, FIG. 4A is an enlarged view of the T part in FIG. 3C, and FIG. 4B is an enlarged view of the U part in FIG. 3C.

As shown in FIG. 3C and the D-part enlarged view of FIG. 3F, a plurality (three in this embodiment) of claw-shaped hooks 203 extending toward the front panel is formed on the surface (inner surface) of the bottom surface decorative plate 200, which is mounted on the bottom surface plate part 13 of the base casing 100. Two of them are formed on both sides of the approximately center of an end portion thereof close to the front panel, and the remaining one is formed at the approximately center thereof. The hooks 203 are engagement portions configured to be engaged with the engagement holes 133 of the bottom surface plate part 13 of the base casing 100. As shown in FIG. 3C and the T-part enlarged view in FIG. 4A, a projection 218 is formed close to the front panel side at the central portion of the center line (line P01-P01) of the bottom surface decorative plate 200. The projection 218 engages with the guide groove 135 of the bottom surface plate part 13 of the base casing 100, regulates the moving direction of the bottom surface decorative plate 200 during mounting, and determines the horizontal position of the bottom surface decorative plate 200. Specifically, when the bottom surface decorative plate 200 is mounted on the bottom surface plate part 13, the projection 218 engages with the wide-width portion 135W of the guide groove 135 of the bottom surface plate part 13. Moreover, when the bottom surface decorative plate 200 is slid toward the front panel in such a state, the horizontal position of the projection 218 is determined by the narrow-width portion 135N. As shown in FIG. 3C and the U-part enlarged view of FIG. 4B, the positioning projection 220 is formed close to the rear panel side at the central portion of the center line (P01-P01 line) of the bottom surface decorative plate 200. The positioning projection 220 engages with the positioning hole 137 of the base casing 100 during mounting of the bottom surface decorative plate 200, determines the position of the bottom surface decorative plate 200 with respect to the base casing 100, and prevents misalignment of the bottom surface decorative plate 200 with respect to the base casing 100. Since the bottom surface decorative plate 200 is elastically deformed until the positioning projection 220 is engaged with the positioning hole 137, there is no problem as long as the positioning hole 137 is generally circular.

Moreover, wall surfaces (hereinafter, referred to "side surfaces") 211 are formed on left and right end portions of the bottom surface decorative plate 200. As shown in FIG. 3B and the C-part enlarged view of FIG. 3E, a plurality (three in this example) of engagement holes 201 as the first engagement portion is formed on both side surfaces 211. The engagement holes 201 are engagement portions configured to be engaged with the lower hooks 301 (later described) as the second engagement portion of both side surface decorative plates 300 (300L, 300R).

As shown in FIG. 3D and the E-part enlarged view of FIG. 3G, the L shaped hooks 205 extending toward the front panel are provided on both sides of the approximately center of an end portion of the bottom surface decorative plate 200 close the rear panel. The hooks 205 are engagement portions configured to be engaged with the engagement holes 35 of the rear panel 30 when the bottom surface decorative plate 200 is mounted on the bottom surface plate part 13 of the base casing 200.

Figure 5A:
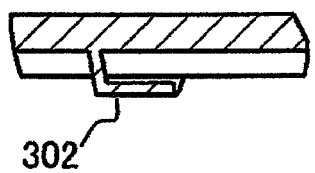
FIGS. 5A to 5E are schematic structural views of a side surface decorative plate according to the present embodiment.
Figure 5B:
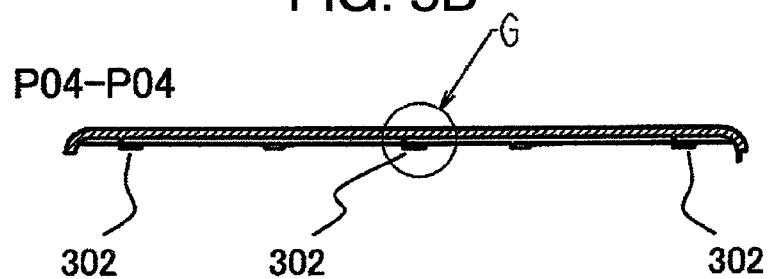
Figure 5C:
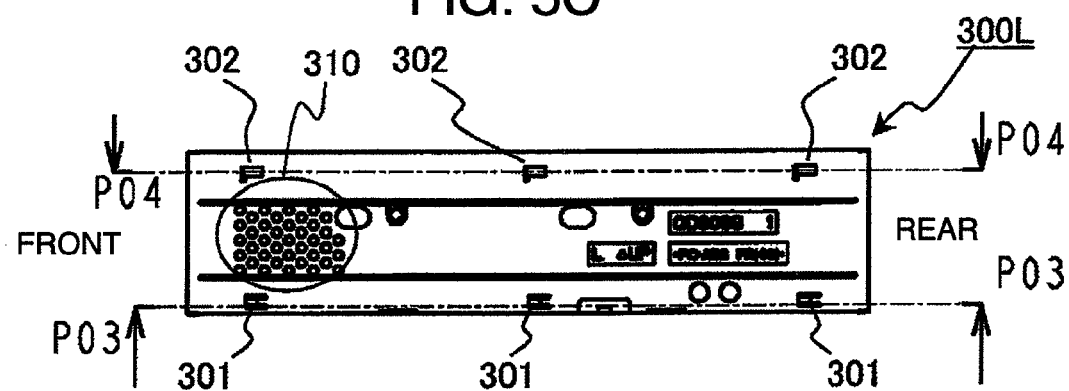
Figure 5D:
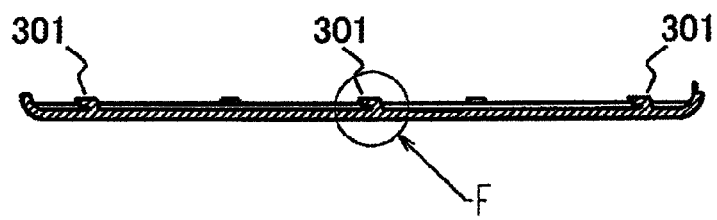
Figure 5E:
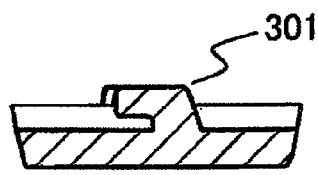

FIGS. 5A to 5E are schematic structural views of the side surface decorative plate according to the present embodiment. Herein, only the left side surface decorative plate 300L of the side surface decorative plates will be described. In the drawing figures, FIG. 5C is a top plan view of the left side surface decorative plate as viewed from the base casing side, FIG. 5B is a cross-sectional view taken along the line P04-P04 in FIG. 5C, FIG. 5A is an enlarged view of the G part in FIG. 5B, FIG. 5D is a cross-sectional view taken along the line P03-P03 in FIG. 5C, and FIG. 5E is an enlarged view of the F part in FIG. 5D.

As shown in FIG. 5C, a plurality (three in the embodiment) of hooks 301 as the second engagement portions and a plurality (three in this embodiment) of hooks 302 as the third engagement portions are formed on the left side surface decorative plate 300L, which is mounted on the left side surface plate part 11L of the base casing 100, The hooks 301 as the second engagement portion are engaged with the engagement holes 201 as the first engagement portion of the bottom surface decorative plate 200. As shown in FIG. 5D and the F-part enlarged view of FIG. 5E, the hooks 301 are provided at three locations disposed at the approximately center of the lower end portion of the left side surface decorative plate 300L, at the front portion close to the front panel, and at the rear portion close to the rear panel. The hooks 301 have a claw-like shape extending toward the front panel.

As shown in FIG. 5B and the G-part enlarged view of FIG. 5A, the hooks 302 as the third engagement portion are provided at three locations disposed at the approximately center of the upper end portion of the left side surface decorative plate 300L, at the front portion close to the front panel, and at the rear portion close to the rear panel. The hooks 302 have a claw-like shape extending toward the rear panel, opposite to the extending direction of the hooks 301 as the second engagement portion.

Figure 7A:
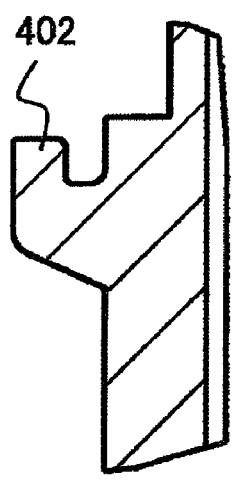
FIGS. 7A to 7D are schematic structural views of the top surface decorative plate according to the present embodiment.
Figure 7B:
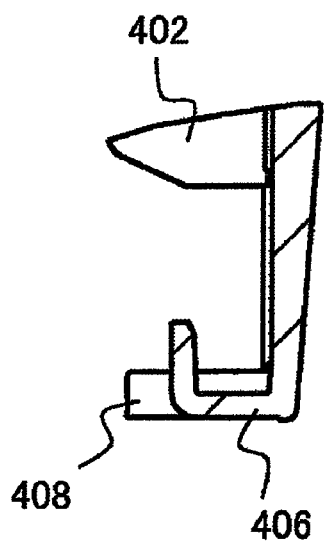
Figure 7C:
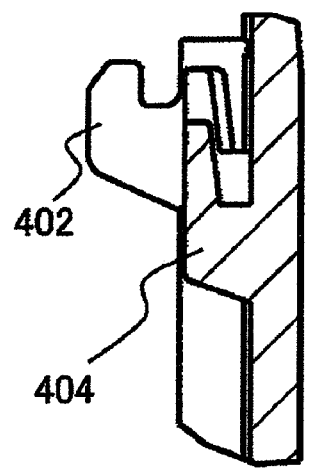
Figure 7D:
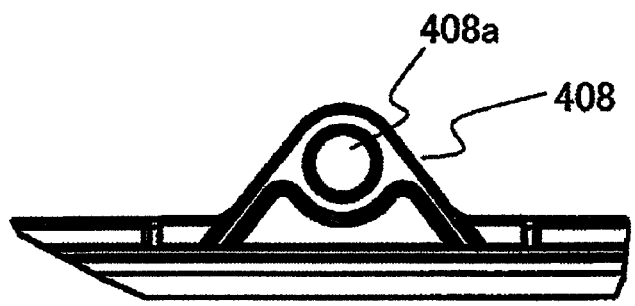

FIGS. 6A to 6E and 7A to 7D are schematic structural views of the top surface decorative plate according to the present embodiment. In the drawing figures, FIG. 6A is a top plan view of the top surface decorative plate as viewed from the base casing side, FIG. 6B is a view of the top surface decorative plate as viewed from the rear panel side, FIG. 6C is a cross-sectional view taken along the line P5-P5 in FIG. 6A, FIG. 6D is a cross-sectional view taken along the line P6-P6 in FIG. 6A, and FIG. 6E is a cross-sectional view taken along the line P7-P7 in FIG. 6A. FIG. 7A is an enlarged view of the H part in FIG. 6C, FIG. 7B is an enlarged view of the J part in FIG. 6D, FIG. 7C is an enlarged view of the K part in FIG. 6E, and FIG. 7D is an enlarged view of the S part in FIG. 6B.

As shown in FIG. 6A, the top surface decorative plate 400 is provided with hooks 404 on a surface thereof mounted on the top surface plate 40 of the base casing 100, which are located at three locations disposed at the approximately center of an end portion thereof close to the front panel and at left and right end portions thereof. The hooks 404 are engagement portions configured to be engaged with the engagement holes 44 formed in portions of the top surface plate 40 of the base casing 100 close to the front panel. As shown in FIG. 6E and the K-part enlarged view of FIG. 7C, the hooks 404 have a claw-like shape extending toward the front panel.

Moreover, hooks 402 as the fourth engagement portion configured to be engaged with the hooks 302 as the third engagement portion of the both side surface decorative plates 300 (300L, 300R) are provided at three locations disposed at the approximately center of the left and right end portions of the top surface decorative plate 400, at the front portion close to the front panel, and at the rear portion close to the rear panel. As shown in FIG. 6C and the H-part enlarged view of FIG. 7A, the hooks 402 have a claw-like shape extending toward the front panel. The extending direction of the claw-like shape of the hooks 402 is opposite to the extending direction of the claw-like shape of the hooks 302 so as to be engaged with the hooks 302 (see FIGS. 5A to 5E)

Furthermore, hooks 406 are formed at two locations in the vicinity of the left and right end portions of the top surface decorative plate 400 close to the rear panel. The hooks 406 are engagement portions configured to be engaged with the engagement holes 36 of the rear panel 30 when the top surface decorative plate 400 are mounted on the top surface plate 40 of the base casing 100. As shown in FIG. 6D and the J-part enlarged view of FIG. 7B, the hooks 406 have an L shape extending toward the front panel.

Furthermore, as shown in FIG. 6B and the S-part enlarged view of FIG. 7D, projections 408 are provided at two locations on the left and right sides at the approximately central portion of the end portion close to the rear panel. Moreover, a hole 408a is formed in each of the projections 408. Therefore, the top surface decorative plate 400 can be fixed by means of screws or the like to the base casing 100 after being mounted on the base casing 100.

Next, a description of a design cover attachment structure of sequentially mounting (engaging) the bottom surface decorative plate 200, both side surface decorative plates 300 (300L, 300R), and the top surface decorative plate 400 to the base casing 100 will be provided with reference to FIGS. 9 to 13.

Figure 9A:
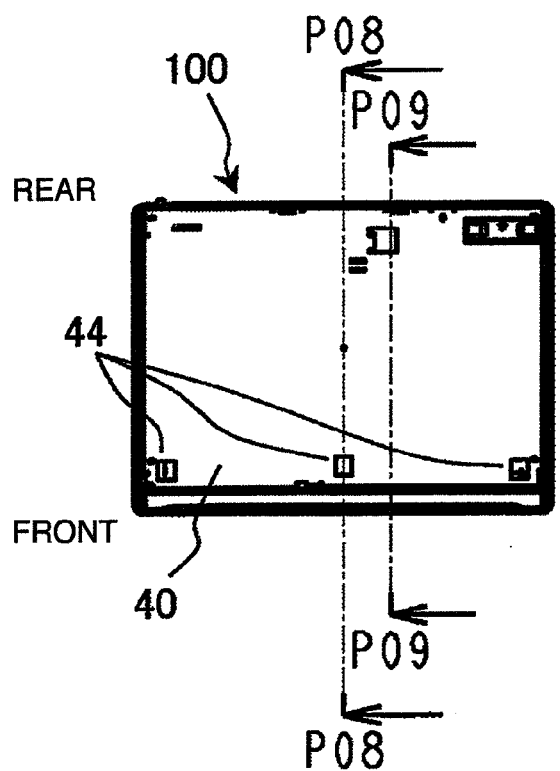
FIGS. 9A to 9E are views for explaining a state where the bottom surface decorative plate is attached to the base casing according to the present embodiment.
Figures 9B, 9C:
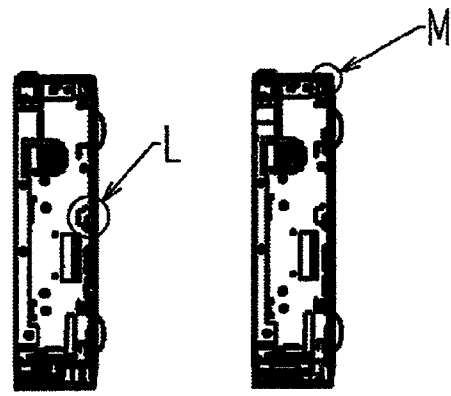
Figure 9D:
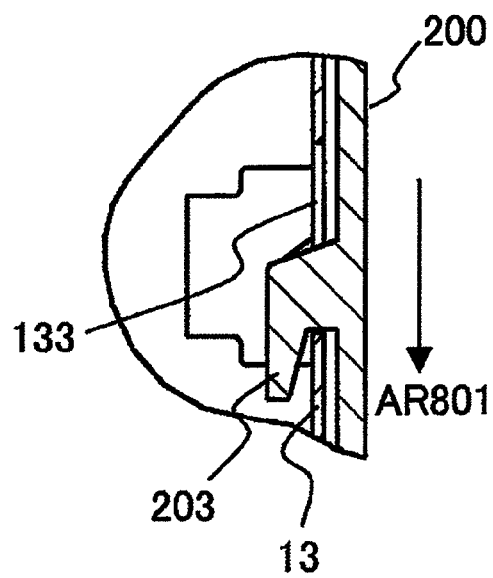
Figure 9E:
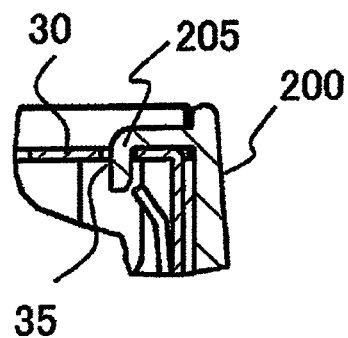

FIGS. 9A to 9E are views for explaining a state where the bottom surface decorative plate is attached to the base casing according to the present embodiment. In the drawing figures, FIG. 9A is a top plan view of the base casing mounting the bottom surface decorative plate thereon as viewed from the upper side, FIG. 9B is a cross-sectional view taken along the line P08-P08 in FIG. 9A, FIG. 9C is a cross-sectional view taken along the line P09-P09 in FIG. 9A, FIG. 9D is an enlarged view of an L part in FIG. 9B, and FIG. 9E is an enlarged view of the M part in FIG. 9C.

When the bottom surface decorative plate 200 is mounted on the bottom surface plate part 13 of the base casing 100, the projection 218 of the bottom surface decorative plate 200 is tightly fitted to the rear portion (the wide-width portion 135W) of the guide groove 135 formed in the bottom surface plate part 13 from the lower side. At this time, the hooks 203 of the bottom surface decorative plate 200 are tightly fitted to the engagement holes 133 formed in the bottom surface plate part 13 from the lower side. Thereafter, the bottom surface decorative plate 200 is slid frontward (toward the front panel) being the extending direction of the hooks 203 as indicated by the arrow AR801 in FIG. 9D, so that the positioning projection 220 is tightly fitted to the positioning hole 137. At this time, the hooks 203 engage with the engagement holes 133, and as shown in FIG. 9E, the hooks 205 of the bottom surface decorative plate are inserted into the engagement holes 35 of the rear panel 30 to be latched. In this way, the bottom surface decorative plate 200 is firmly fixed to the base casing 100 at a desired position. Moreover, the narrow-width portion 135N of the guide groove 135 of the bottom surface plate part 13 determines the horizontal position during the movement of the bottom surface decorative plate 200 along the arrow AR801 and allows the engagement to be performed smoothly.

Next, the base casing 100 mounting the bottom surface decorative plate 200 thereon is mounted on both side surface decorative plates 300 (300L, 300R). It is to be noted that the attachment order of the respective side surface decorative plates 300L and 300R is arbitrary.

Figure 10B:
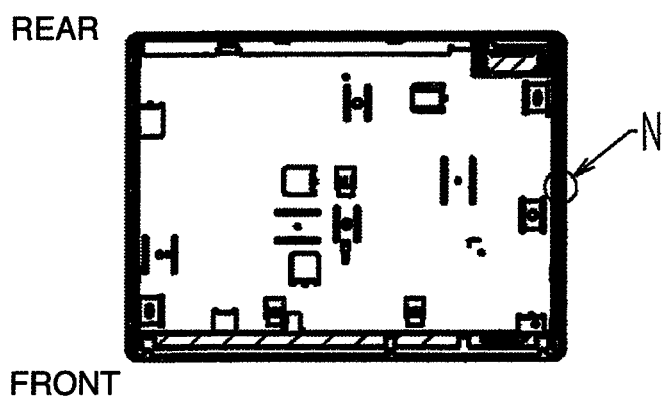
FIGS. 10A to 10C are views for explaining a state where both side surface decorative plates are attached to the base casing mounting the bottom surface decorative plate thereon according to the present embodiment.
Figure 10C:
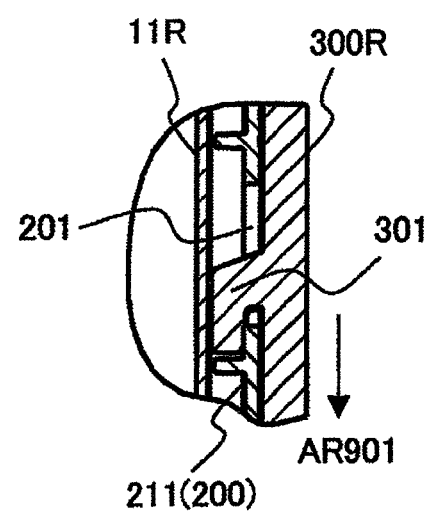
Figure 10A:
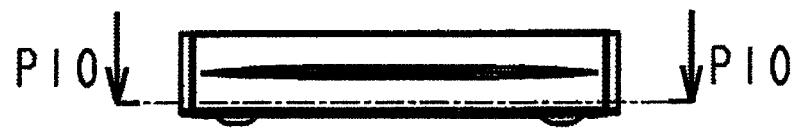

FIGS. 10A to 10C are views for explaining a state where both side surface decorative plates are attached to the base casing mounting the bottom surface decorative plate thereon according to the present embodiment. In the drawing figures, FIG. 10A is a top plan view of the base casing mounting the bottom surface decorative plate and both side surface decorative plates thereon as viewed from the front panel side, FIG. 10B is a cross-sectional view taken along the line P10-P10 in FIG. 10A, and FIG. 10C is an enlarged view of the N part in FIG. 10B. The attachment method will be described for the right side surface decorative plate 300R for the simplicity's sake.

When the right side surface decorative plate 300R is mounted on the right side surface plate part 11R of the base casing 100, the lower hooks 301 of the right side surface decorative plate 300R are tightly fitted to the engagement holes 201 formed on the right end portion of the bottom surface decorative plate 200 from the right side. Thereafter, the right side surface decorative plate 300R is slid frontward (toward the front panel) being the extending direction of the lower hooks 301 as indicated by the arrow AR901 in FIG. 10C, so that the lower hooks 301 are engaged with the engagement holes 201. Similar operations are performed for the left side surface decorative plate 300L.

Next, the top surface decorative plate 400 is mounted on the base casing 100 mounting the bottom surface decorative plate 200 and both side surface decorative plates 300 (300L, 300R) thereon.

Figure 11A:
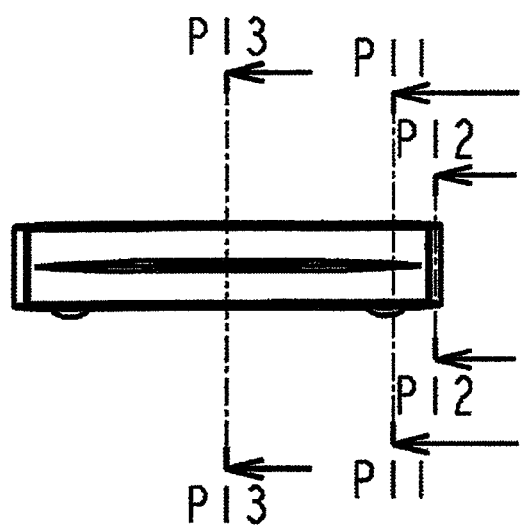
FIGS. 11A to 11C are views for explaining a state where the top surface decorative plate is attached to the base casing mounting the bottom surface decorative plate and the side surface decorative plates thereon according to the present embodiment.
Figure 11B:
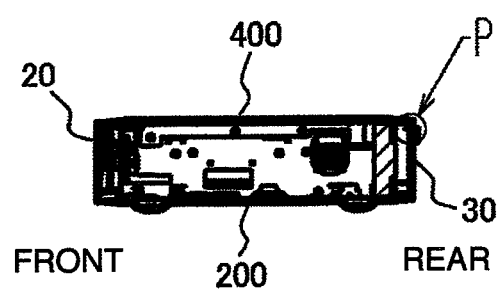
Figure 11C:
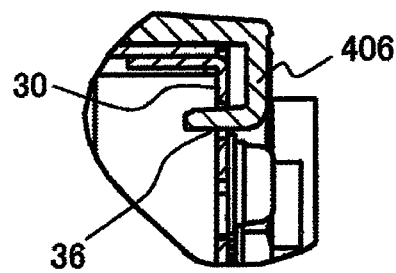
Figure 12A:
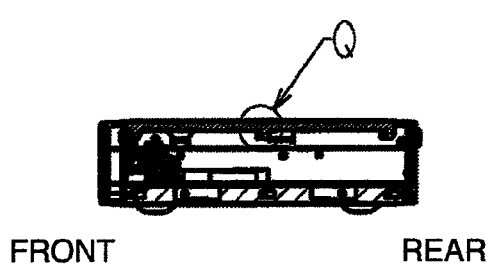
FIGS. 12A to 12D are views for explaining a state where the top surface decorative plate is attached to the base casing mounting the bottom surface decorative plate and the side surface decorative plates thereon according to the present embodiment.
Figure 12B:
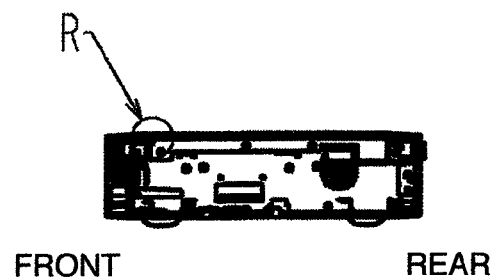
Figure 12C:
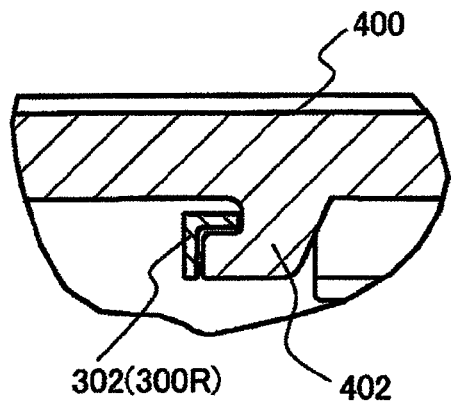
Figure 12D:
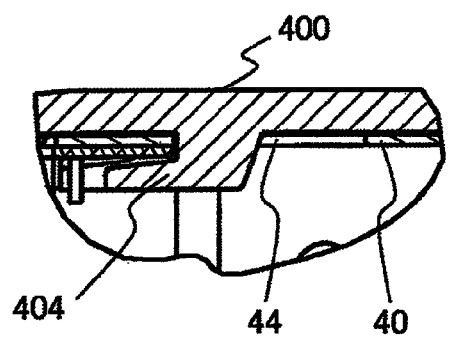

FIGS. 11A to 12D are views for explaining a state where the top surface decorative plate is attached to the base casing mounting the bottom surface decorative plate and both side surface decorative plates thereon according to the present embodiment. In the drawing figures, FIG. 11A is a top plan view of the state where the top surface decorative plate is attached to the base casing mounting the bottom surface decorative plate and both side surface decorative plates thereon, as viewed from the front panel side, FIG. 11B is a cross-sectional view taken along the line P11-P11 in FIG. 11A, and FIG. 11C is an enlarged view of the P part in FIG. 11B. FIG. 12A is a cross-sectional view taken along the line P12-P12 in FIG. 11A, FIG. 12B is an enlarged view of the Q part in FIG. 12A, FIG. 12C is a cross-sectional view taken along the line P13-P13 in FIG. 11A, and FIG. 12D is an enlarged view of the R part in FIG. 12B.

When the top surface decorative plate 400 is mounted on the top surface plate 40 of the base casing 100 mounting the bottom surface decorative plate 200 and both side surface decorative plates 300 thereon, the hooks 404 of the top surface decorative plate 400 are aligned with the engagement holes 44 of the top surface plate 40. When the hooks 404 of the top surface decorative plate 400 are well aligned with the engagement holes 44 of the top surface plate 40, the upper hooks 302 of both side surface decorative plates 300 will be aligned with the hooks 402 of the top surface decorative plate 400, and likewise, the hooks 406 of the top surface decorative plate 400 will be aligned with the engagement holes 36 of the rear panel 30. When these engagement portions are well aligned, the top surface decorative plate 400 is pressed downward, so that the hooks 404 of the top surface decorative plate 400 are tightly fitted to the engagement holes 44 of the top surface plate 40. Accompanied with this, the upper hooks 302 of both side surface decorative plates 300 are tightly fitted to the hooks 402 of the top surface decorative plate 400. Thereafter, the top surface decorative plate 400 is slid toward the front panel in such a state. By the sliding movement, as shown in FIG. 12D, the hooks 404 of the top surface decorative plate 400 are engaged with the engagement holes 44 of the top surface plate 40. Moreover, as shown in FIG. 12C, the hooks 402 of the top surface decorative plate 400 are engaged with the upper hooks 302 of both side surface decorative plates 300. Furthermore, as shown in FIG. 11C, the hooks 406 of the top surface decorative plate 400 are engaged with the engagement holes 36 of the rear panel 30.

Figure 13:
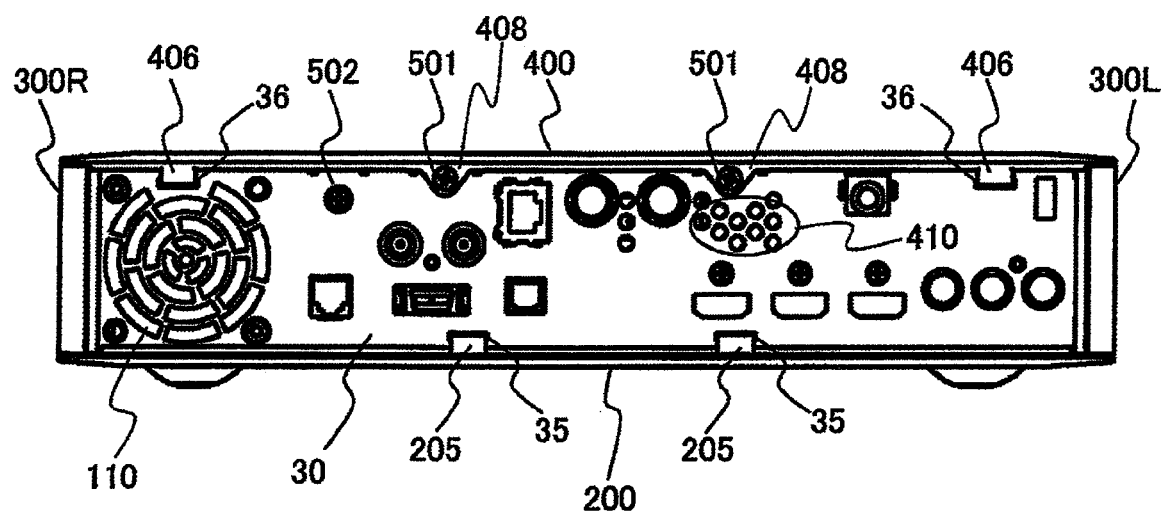
FIG. 13 is a view showing a state where the bottom surface decorative plate, the side surface decorative plates, and the top surface decorative plate are mounted on the base casing according to the present embodiment, as viewed from the rear panel.

In this manner, after the bottom surface decorative plate 200, both side surface decorative plates 300 (300L, 300R), and the top surface decorative plate 400 are sequentially mounted on the base casing 100, as shown in FIG. 13, the top surface decorative plate 400 is fixed to the rear panel 30 attached to the rear surface of the base casing 100 by means of two screws 501, for example.

FIG. 13 is a view showing a state where the bottom surface decorative plate, both side surface decorative plates, and the top surface decorative plate are mounted on the base casing according to the present embodiment, as viewed from the rear panel.

As described above with respect to FIGS. 6A to 7D, two projections 408 having screw holes 408a are provided to end portions of the top surface decorative plate 400 close to the rear panel. Therefore, the top surface decorative plate 400 mounted on the base casing 100 by being engaged with both side surface decorative plates 300 (300L, 300R) can be fixed to the base casing 100 through the holes 408a by means of the screws 501.

Moreover, the screws 502 also fix the top surface plate 40 to the rear panel 30 fixed to the base chassis 10. As described above with respect to FIG. 1, the top surface plate 40 is also fixed to both side surface plate parts 11 of the base chassis 10 by means of screws, for example.

As described above, according to the design cover attachment structure of the present embodiment, both side surface decorative plates 300 and the top surface decorative plate 400 can be fixed to the base casing 100 from the rear panel side with least number of screws (two in this embodiment), thereby decreasing the number of assembly steps. Moreover, except for the rear panel side, since the fixing means such as screws for fixing the bottom surface decorative plate 200, both side surface decorative plates 300, and the top surface decorative plate 400 are not visible from outside, it is possible to improve the overall outer appearance. Therefore, it is possible to provide a receiver that can be combined with a display apparatus such as an expensive flat-screen television.

Since both side surface decorative plates 300 and the top surface decorative plate 400 being the exterior components are made of resin, they are prone to scratches. In receivers combined with an expensive display apparatus and installed at places near the display apparatus where they attract customers' attention, they are requested to exhibit good outer appearance to the customers. Therefore, the customers may frequently request a replacement service for the side surface decorative plates 300 or the top surface decorative plate 400. In the present embodiment, the side surface decorative plates 300 and the top surface decorative plate 400 can be disassembled and removed in a simple manner by first removing two fixing screws from the rear panel side, and rearwardly sliding the top surface decorative plate 400 to be removed, and then rearwardly sliding the side surface decorative plates 300 to be removed. In addition, since the removed design cover can be disassembled into the top surface decorative plate 400, the side surface decorative plates 300, and the bottom surface decorative plate 200, the respective decorative plates can be individually replaced as necessary. In this way, it is possible to improve the replacement service of the design cover and decrease the replacement cost.

In the above-described embodiment, both side surface decorative plates 300 (300L, 300R) are engaged with the bottom surface decorative plate. However, the present invention is not limited to this. For example, the side surface decorative plates may be configured to be engaged with the side surface plate parts 11 (11L, 11R) or the bottom surface plate part 13 of the base chassis 10. Particularly, when the vertical installation of the receiver is not recommended, the bottom surface decorative plate 200 may not be provided. In such a case, in lieu of the first engagement portion of the bottom surface decorative plate, a first engagement portion may be provided to the side surface plate parts 11 (11L, 11R) of the base chassis 10 to be engaged with the second engagement portion of the side surface decorative plates 300 (300L, 300R).

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An electronic apparatus comprising:
   a casing including a top surface plate, a bottom surface plate, a rear surface panel, a left side surface plate, and a right side surface plate;
   a top surface cover arranged to cover the top surface plate of the casing;
   a bottom surface cover arranged to cover the bottom surface plate of the casing;
   a first side surface cover arranged to cover one of the left side surface plate and the right side surface plate of the casing; and
   a second side surface cover arranged to cover the other of the left side surface plate and the right side surface plate of the casing;
   wherein either of the top surface cover or each of the first and second side surface covers has a first engage portion with a hook-shape, and the other of the top surface cover or each of the first and second side surface covers has a first engagement hole configured to receive therein the first engage portion and to allow therein the received first engage portion to move with respect to the first engagement hole, thereby enabling the first engage portion to be engaged with the other of the top surface cover or each of the first and second side surface covers;
   wherein either of the bottom surface cover or each of the first and second side surface covers has a second engage portion with a hook-shape, and the other of the bottom surface cover or each of the first and second side surface covers has a second engagement hole configured to receive therein the second engage portion and to allow therein the received second engage portion to move with respect to the second engagement hole, thereby enabling the second engage portion to be engaged with the other of the bottom surface cover or each of the first and second side surface covers;

wherein the bottom surface cover and the bottom surface plate are arranged to engage with each other; and wherein the top surface cover is attached to the rear panel by a screw.

2. The electronic apparatus according to claim 1, wherein the casing is made of metal, and the top surface cover, the first and second side surface covers, and the bottom surface cover are made of resin.

3. The electronic apparatus according to claim 1, wherein a front panel is attached to a front surface of the casing.

4. The electronic apparatus according to claim 1, wherein at least one of the first and second side surface covers is configured to be attached to a stand for supporting the electronic apparatus while keeping the top and bottom surface covers vertical.

5. An electronic apparatus comprising:

a casing including a top surface plate, a bottom surface plate, a rear surface panel, a left side surface plate, and a right side surface plate;

a top surface cover arranged to cover the top surface plate of the casing;

a bottom surface cover arranged to cover the bottom surface plate of the casing;

a first side surface cover arranged to cover one of the left side surface plate and the right side surface plate of the casing; and a second side surface cover arranged to cover the other of the left side surface plate and the right side surface plate of the casing;

wherein either (a) the top surface cover has first engage portions each with a hook-shape, and each of the first and second side surface covers has a first engagement hole configured to receive therein the first engage portion and to allow therein the received first engage portion to move with respect to the first engagement hole, thereby enabling the first engage portion to be engaged with each of the first and second side surface covers, or (b) each of the first and second side surface covers has a first engage portion with a hook-shape, and the top surface cover has first engagement holes, each configured to receive therein a first engage portion and to allow therein the received first engage portion to move with respect to the relevant first engagement hole, thereby enabling the first engage portion to be engaged with the top surface cover;

wherein either (a) the bottom surface cover has a second engage portion with a hook-shape, and each of the first and second side surface covers has a second engagement hole configured to receive therein the second engage portion and to allow therein the received second engage portion to move with respect to the second engagement hole, thereby enabling the second engage portion to be engaged with each of the first and second side surface covers, or (b) each of the first and second side surface covers has a second engage portion with a hook-shape, and the bottom surface cover has second engagement holes, each configured to receive therein a second engage portion and to allow therein the received second engage portion to move with respect to the relevant second engagement hole, thereby enabling the second engage portion to be engaged with the bottom surface cover;

wherein the bottom surface cover and the bottom surface plate are arranged to engage with each other; and wherein the top surface cover is attached to the rear panel by a screw.

6. The electronic apparatus according to claim 5, wherein the casing is made of metal, and the top surface cover, the first and second side surface covers, and the bottom surface cover are made of resin.

7. The electronic apparatus according to claim 5, wherein a front panel is attached to a front surface of the casing.

8. The electronic apparatus according to claim 5, wherein at least one of the first and second side surface covers is configured to be attached to a stand for supporting the electronic apparatus while keeping the top and bottom surface covers vertical.

* * * * *